United States Patent
Hirose et al.

(10) Patent No.: US 10,186,837 B2
(45) Date of Patent: Jan. 22, 2019

(54) LASER DEVICE

(71) Applicants: Kyoto University, Kyoto-shi, Kyoto (JP); HAMAMATSU PHOTONICS K.K., Hamamatsu-shi, Shizuoka (JP)

(72) Inventors: Kazuyoshi Hirose, Hamamatsu (JP); Akiyoshi Watanabe, Hamamatsu (JP); Yoshitaka Kurosaka, Hamamatsu (JP); Takahiro Sugiyama, Hamamatsu (JP); Susumu Noda, Kyoto (JP)

(73) Assignees: Kyoto University, Kyoto-shi, Kyoto (JP); HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/120,149

(22) PCT Filed: Feb. 13, 2015

(86) PCT No.: PCT/JP2015/054005
§ 371 (c)(1),
(2) Date: Aug. 19, 2016

(87) PCT Pub. No.: WO2015/129490
PCT Pub. Date: Sep. 3, 2015

(65) Prior Publication Data
US 2017/0222399 A1    Aug. 3, 2017

(30) Foreign Application Priority Data
Feb. 28, 2014    (JP) .................................. 2014-038912

(51) Int. Cl.
*H01S 5/026*    (2006.01)
*H01S 5/10*    (2006.01)
(Continued)

(52) U.S. Cl.
CPC .......... *H01S 5/105* (2013.01); *H01S 5/02292* (2013.01); *H01S 5/02296* (2013.01);
(Continued)

(58) Field of Classification Search
CPC ............. H01S 5/02292; H01S 5/02296; H01S 5/34313; H01S 5/1014; H01S 5/1003
(Continued)

(56) References Cited

U.S. PATENT DOCUMENTS

2005/0063438 A1*    3/2005    Capasso .................. B82Y 20/00
                                                                                    372/50.21
2005/0157303 A1*    7/2005    Langford ............... B82Y 20/00
                                                                                    356/437
(Continued)

FOREIGN PATENT DOCUMENTS

JP    S62-42586 A    2/1987
JP    S63-226990 A    9/1988
(Continued)

OTHER PUBLICATIONS

International Preliminary Report on Patentability dated Sep. 15, 2016 for PCT/JP2015/054005.
(Continued)

*Primary Examiner* — Tuan Nguyen
(74) *Attorney, Agent, or Firm* — Drinker Biddle & Reath LLP

(57) ABSTRACT

A control circuit in this laser equipment drives a drive circuit of a photonic crystal laser element under a predetermined condition. It was found that a wavelength width of a laser beam to be output from the photonic crystal laser element is dependent on a standardized drive current k and a pulse width T, and had a predetermined relationship with these. By meeting this condition, a laser beam with a plurality of wavelengths can be controlled and output.

27 Claims, 25 Drawing Sheets

(51) Int. Cl.
*H01S 5/18* (2006.01)
*H01S 5/042* (2006.01)
*H01S 5/343* (2006.01)
H01S 5/00 (2006.01)
H01S 5/022 (2006.01)
H01S 5/062 (2006.01)
H01S 5/065 (2006.01)

(52) U.S. Cl.
CPC ............ *H01S 5/042* (2013.01); *H01S 5/0425* (2013.01); *H01S 5/0622* (2013.01); *H01S 5/18* (2013.01); *H01S 5/34313* (2013.01); *H01S 5/34353* (2013.01); *H01L 2224/48091* (2013.01); *H01S 5/005* (2013.01); *H01S 5/0078* (2013.01); *H01S 5/02208* (2013.01); *H01S 5/02276* (2013.01); *H01S 5/0653* (2013.01); *H01S 5/06216* (2013.01)

(58) Field of Classification Search
USPC ....... 348/164; 250/495.1; 372/50.122, 38.02, 372/26, 38.07, 44
See application file for complete search history.

(56) References Cited

U.S. PATENT DOCUMENTS

2011/0248242 A1* 10/2011 Ellis ...................... B82Y 20/00
257/23

2012/0146066 A1* 6/2012 Tischler ................ H01L 27/156
257/89
2012/0170109 A1 7/2012 Letartre et al.
2013/0092897 A1* 4/2013 Shambat ................ H01L 33/04
257/13

FOREIGN PATENT DOCUMENTS

| | | | | | |
|---|---|---|---|---|---|
| JP | S63-287088 | A | 11/1988 | | |
| JP | H01-181494 | A | 7/1989 | | |
| JP | H03-112183 | A | 5/1991 | | |
| JP | 2000-332351 | A | 11/2000 | | |
| JP | 2000332351 | | * 11/2000 | ............... | G02B 5/18 |
| JP | 2000-349390 | A | 12/2000 | | |
| JP | 2000349390 | | * 12/2000 | ............... | H01S 5/00 |
| JP | 2001-284705 | A | 10/2001 | | |
| JP | 2005-522694 | A | 7/2005 | | |
| JP | 2005522694 | | * 7/2005 | | |
| JP | 2011-258703 | A | 12/2011 | | |
| JP | 2012-150408 | A | 8/2012 | | |
| JP | 2013-016689 | | 1/2013 | | |
| WO | WO-2003/087787 | A1 | 10/2003 | | |
| WO | WO-2007/099847 | A1 | 9/2007 | | |

OTHER PUBLICATIONS

Dai Ohnishi et al., "Room temperature continuous wave operation of a surface-emitting two-dimensional photonic crystal diode laser," Optics Express, Apr. 19, 2004, pp. 1562-1568, vol. 12, No. 8.

* cited by examiner

Fig.17

(Band edge A)

| I(A) | J (kA/cm²) | k | WA(nm) |
|---|---|---|---|
| 20 | 50.0 | 86.2 | 0.130 |
| 25 | 62.5 | 107.8 | 2.344 |
| 30 | 75.0 | 129.3 | 3.927 |
| 35 | 87.5 | 150.9 | 5.421 |
| 40 | 100.0 | 172.4 | 6.376 |
| 45 | 112.5 | 194.0 | 7.541 |

(Band edge B)

| I(A) | J (kA/cm²) | k | WB(nm) |
|---|---|---|---|
| 1 | 2.5 | 4.3 | 0.617 |
| 5 | 12.5 | 21.6 | 1.039 |
| 10 | 25.0 | 43.1 | 1.362 |
| 15 | 37.5 | 64.7 | 2.053 |
| 20 | 50.0 | 86.2 | 2.752 |
| 25 | 62.5 | 107.8 | 3.487 |
| 30 | 75.0 | 129.3 | 4.197 |
| 35 | 87.5 | 150.9 | 4.834 |
| 40 | 100.0 | 172.4 | 5.424 |
| 45 | 112.5 | 194.0 | 5.963 |

(Band edge A+B)

| Current (A) | J (kA/cm²) | k | WAB(nm) |
|---|---|---|---|
| 50 | 125.0 | 215.5 | 15.308 |
| 55 | 137.5 | 237.1 | 16.411 |
| 60 | 150.0 | 258.6 | 17.018 |

Fig.19

(Band edge A)

| I(A) | J (kA/cm²) | k | WA(nm) |
|---|---|---|---|
| 20 | 50.0 | 86.2 | 1.425 |
| 25 | 62.5 | 107.8 | 2.397 |
| 30 | 75.0 | 129.3 | 3.919 |
| 35 | 87.5 | 150.9 | 5.454 |
| 40 | 100.0 | 172.4 | 6.355 |
| 45 | 112.5 | 194.0 | 7.957 |

(Band edge A+B)

| I(A) | J (kA/cm²) | k | WAB(nm) |
|---|---|---|---|
| 50 | 125.0 | 215.5 | 15.308 |
| 55 | 137.5 | 237.1 | 16.411 |
| 60 | 150.0 | 258.6 | 17.018 |

(Band edge B)

| I(A) | J (kA/cm²) | k | WB(nm) |
|---|---|---|---|
| 1 | 2.5 | 4.3 | 0.660 |
| 5 | 12.5 | 21.6 | 1.062 |
| 10 | 25.0 | 43.1 | 1.390 |
| 15 | 37.5 | 64.7 | 2.038 |
| 20 | 50.0 | 86.2 | 2.731 |
| 25 | 62.5 | 107.8 | 3.476 |
| 30 | 75.0 | 129.3 | 4.173 |
| 35 | 87.5 | 150.9 | 4.838 |
| 40 | 100.0 | 172.4 | 5.388 |
| 45 | 112.5 | 194.0 | 5.963 |

(b)

(a)

(b)

(a)

(a)

(b)

LASER DEVICE

TECHNICAL FIELD

The present invention relates to laser equipment using a photonic crystal laser element.

BACKGROUND ART

Conventionally, laser equipment capable of obtaining a laser beam with a narrow radiation angle in a plurality of bands has been demanded. For example, in Non-Patent Document 1, by using a PCSEL (Photonic Crystal Surface Emitting Laser), a narrow radiation beam with a beam spread angle of 1° or less can be provided by a simple configuration. Patent Document 1 discloses a semiconductor wavelength-variable laser light source that uses a diffraction grating as an external resonator. Patent Document 2 discloses a structure that varies the wavelength by adjusting the temperatures of a plurality of semiconductor DFB laser elements.

In recent years, in photonic crystal laser elements, particularly in PCSELs, higher output with narrow radiation and high beam quality has been realized. Unlike conventional semiconductor laser light sources, a PCSEL outputs a circular and narrow radiation beam, and has the advantage that a subsequent optical system can be significantly simplified, and wavelength conversion without a collimating lens that was conventionally impossible has also been demonstrated. The high beam quality of the PCSEL enables micro-condensing up to a diffraction limit, so that high energy density can be realized. Based on these superior features, various applications to microfabrication, high-resolution sensing, and lens-free structures, etc., have been expected.

CITATION LIST

Patent Literature

Patent Document 1: Japanese Unexamined Patent Publication No. 2012-150408
Patent Document 2: Japanese Unexamined Patent Publication No. 2011-258703

Non Patent Literature

Non-Patent Document 1: D. Ohnishi, et. al., "Room temperature continuous wave operation of a surface-emitting two-dimensional photonic crystal diode laser," Opt. Express., 12, pp. 1562-1568 (2004).

SUMMARY OF INVENTION

Technical Problem

In conventional PCSELs, the laser beam wavelength is prescribed according to the photonic crystal interval, so that it is difficult for a wavelength deviating from a designed wavelength to correspond. On the other hand, laser equipment capable of successively outputting laser beams with a plurality of wavelengths by using a photonic crystal laser element is unknown. If laser beams with a plurality of wavelengths are successively obtained, this offers an advantage that, by integrating the laser beams, they can be used as a broadband laser beam, and by temporally resolving this, laser beams with individual wavelengths can be selectively used.

The present invention was made in view of this problem, and an object thereof is to provide single laser equipment capable of outputting a laser beam with a target wavelength, specifically, a plurality of wavelengths.

Solution to Problem

In order to solve the above-described problem, laser equipment according to the present invention includes a photonic crystal laser element whose threshold current is Ith, a drive circuit that drives the photonic crystal laser element, and a control circuit that controls the drive circuit, wherein when a standardized drive current k=I/Ith, I is a drive current to be supplied from the drive circuit to the photonic crystal laser element, T is a pulse width (ns) of the drive current I, and J is a current density of the drive current I flowing in the photonic crystal laser element, the control circuit drives the drive circuit under the condition of $k \geq 269.13T^{-0.4653}$ and $J<1000$ kA/cm$^2$.

If the current density J is 1000 kA/cm$^2$ or more, the photonic crystal laser element may be broken, so that the current J is set as described above. In addition, when k meets the above-described relational expression, a laser beam can be obtained at least on a specific short wavelength side.

The control circuit drives the drive circuit under the condition of $k<718.94T^{-0.4642}$. When this condition is met, an advantage that a laser beam can be obtained only on the short wavelength side is provided.

The control circuit drives the drive circuit under the condition of $k \geq 718.94T^{-0.4642}$. When this condition is met, a laser beam can be obtained not only on the short wavelength side but also on the long wavelength side.

The control circuit drives the drive circuit under the condition of $k<2394.6T^{-0.5229}$. When this condition is met, a laser beam can be obtained not only on the short wavelength side but also on the long wavelength side, however, their bands do not overlap each other, and the laser beams with the bands can be individually used.

The control circuit drives the drive circuit under the condition of $k \geq 2394.6T^{-0.5229}$. When this condition is met, a laser beam is generated not only on the short wavelength side but also on the long wavelength side, and their bands successively overlap. Therefore, by integrating these, the laser beams can be used as a successive broadband laser beam, and by temporally resolving this, laser beams with individual wavelengths can be successively and selectively used.

The laser equipment according to the present invention further includes a transmissive diffraction grating disposed to face the photonic crystal laser element. In this case, a traveling direction of a laser beam output from the photonic crystal laser element is deflected with respect to each wavelength by being transmitted through the transmissive diffraction grating.

The laser equipment according to the present invention further includes a prism disposed to face the photonic crystal laser element. In this case, a traveling direction of a laser beam output from the photonic crystal laser element is deflected with respect to each wavelength by being transmitted through the prism.

The laser equipment according to the present invention further includes a transmissive diffraction grating fixed to a light output surface of the photonic crystal laser element. In this case, the transmissive diffraction grating is fixed to the light output surface, so that in addition to the effect of the transmissive diffraction grating, an advantage that the number of components necessary for the configuration can be made small is obtained.

The laser equipment according to the present invention further includes a reflective diffraction grating disposed to face the photonic crystal laser element. In this case, a laser beam output from the photonic crystal laser element is reflected by the reflective diffraction grating, and the traveling direction of the laser beam is deflected with respect to each wavelength.

The laser equipment according to the present invention further includes an opening member that selectively transmits a component traveling in a specific direction of a laser beam output from the photonic crystal laser element. By using the opening member, a laser beam with a specific wavelength component can be selectively extracted.

The laser equipment according to the present invention further includes a deflector that deflects a traveling direction of a laser beam output from the photonic crystal laser element. By using a deflector such as a polygon mirror or an electric optical crystal (KTN, etc.), a laser beam with a specific wavelength can be output in a desired direction.

The laser equipment according to the present invention further includes a bandpass filter disposed to face the photonic crystal laser element. In this case, in a laser beam with a plurality of wavelengths output from the photonic crystal laser element, only a specific wavelength component can be selectively transmitted through the bandpass filter.

Advantageous Effects of Invention

The laser equipment according to the present invention can output a laser beam with a target wavelength, specifically, a plurality of wavelengths.

BRIEF DESCRIPTION OF DRAWINGS

FIG. 17 is a chart of data of the graph shown in FIG. 16.

FIG. 19 is a chart showing data of the graph shown in FIG. 18.

DESCRIPTION OF EMBODIMENTS

Hereinafter, a preferred embodiment of the present invention is described in detail with reference to the drawings. In the description of the drawings, the same elements are designated with the same reference signs to omit overlapping description.

Figure 1:
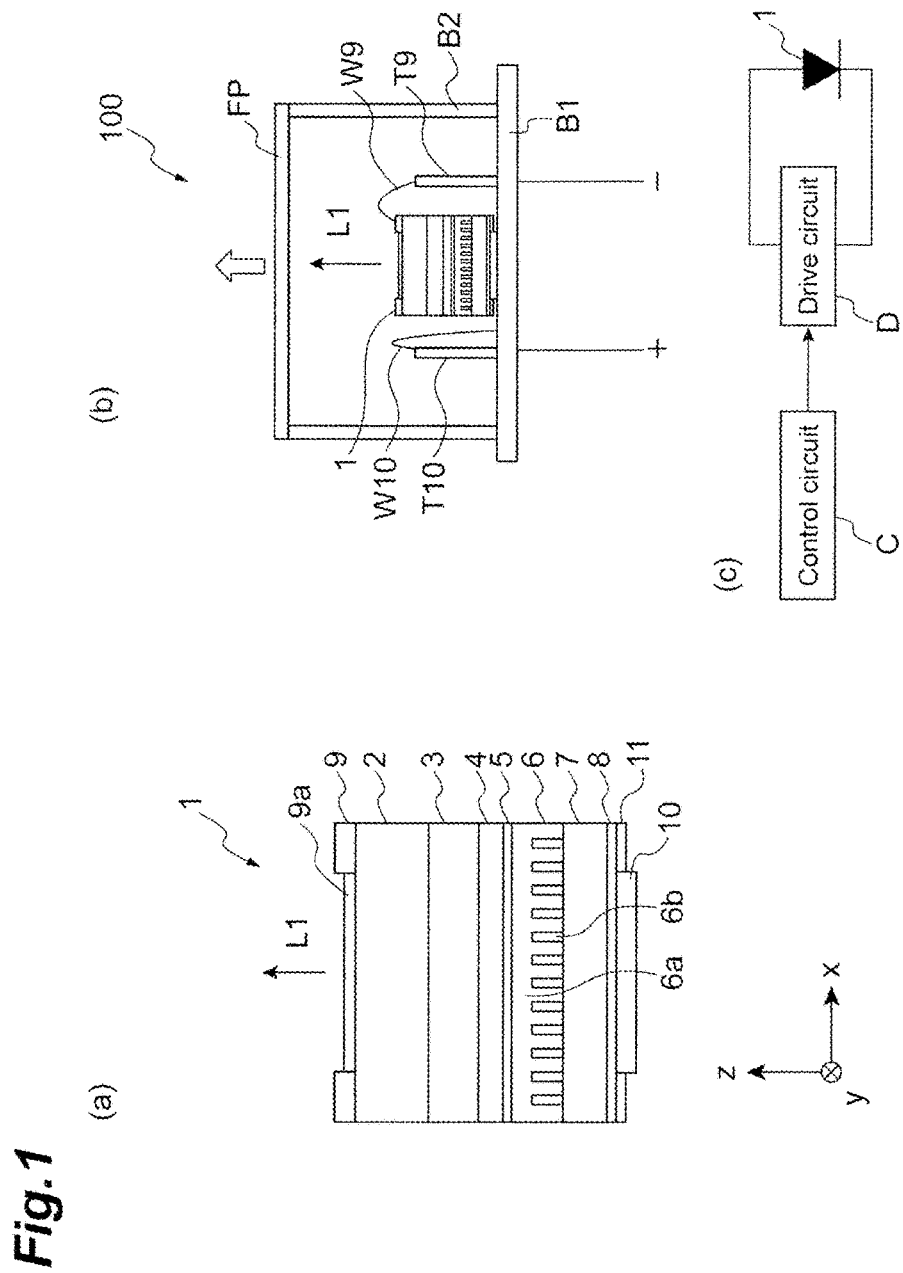
FIG. 1 are a longitudinal sectional view (FIG. 1(*a*)) of a photonic crystal laser element, a longitudinal sectional view (FIG. 1(*b*)) of a laser element, and a block diagram (FIG. 1(*c*)) of the laser equipment.

FIG. 1 are a longitudinal sectional view (FIG. 1(*a*)) of a semiconductor laser element 1, a longitudinal sectional view (FIG. 1(*b*)) of a laser element 100, and a block diagram (FIG. 1(*c*)) of laser equipment. The semiconductor laser element 1 is a photonic crystal laser element, specifically, a regrowth type PCSEL (Photonic Crystal Surface Emitting Laser). FIG. 1(*a*) shows a three-dimensional orthogonal coordinate system that consists of an x axis, a y axis, and a z axis, and a lamination direction of layers is defined as the z axis. On a lower surface of a semiconductor substrate 2, an n-type cladding layer 3, an active layer 4, an electron block layer 5, a photonic crystal layer (diffraction grating layer) 6, a p-type cladding layer 7, and a p-type contact layer 8 are formed in order, and a p-type electrode 10 is in contact with the contact layer 8, and an n-type electrode 9 is in contact with an upper surface of the semiconductor substrate 2. The n-type electrode 9 has a ring shape that has an opening formed at the center, and inside this opening, an antireflection film 9*a* is formed in contact with the semiconductor substrate 2. The contact layer 8 around the p-type electrode 10 is coated with an insulating film 11.

The materials of the semiconductor substrate 2, the cladding layer 3, the active layer 4, the electron block layer 5, the photonic crystal layer 6, and the contact layer 8 are, for example, III-V semiconductor including GaAs. When a voltage is applied to the electrode 9 and the electrode 10 to flow a current between these, a laser beam L1 is output along the z-axis direction.

The material of the semiconductor substrate 2 is n-type GaAs, and has a thickness of approximately 50 to 500 μm (preferably, 100 to 200 μm). An n-type impurity concentration in the semiconductor substrate 2 can be set to $1\times10^{16}$ to $1\times10^{19}$ cm$^3$.

The material of the n-type cladding layer 3 is AlGaAs. The thickness is approximately 2000 nm (preferably, 500 to 4000 nm). An n-type impurity concentration in the cladding layer 3 can be set to $1\times10^{16}$ to $1\times10^{19}$ cm$^3$.

The active layer 4 has, for example, a plurality of quantum well layers. The material of the quantum well layers of the active layer 4 is i-type InGaAs, and the material of the barrier layer is i-type AlGaAs. The active layer 4 can include a guide layer in contact with the n-type cladding layer 3. The material of this guide layer of the active layer 4 is, for example, i-type AlGaAs. The thickness of the active layer 4 is, for example, approximately 140 nm (preferably, 50 to 200 nm). The refractive index of the active layer 4 is approximately 3.5 on the assumption that the central wavelength=940 nm when the drive current I=60 A. For example, when the wavelength band is 900 to 1100 nm, an effective refractive index of the active layer 4 can be set to approximately 3.4 to 3.6.

The material of the electron block layer 5 is i-type or p-type AlGaAs. The electron block layer 5 can include a guide layer in contact with the photonic crystal layer 6. The material of this guide layer of the electron block layer 5 is, for example, i-type AlGaAs. The thickness of the electron block layer 5 is, for example, approximately 30 nm (preferably, 20 to 100 nm).

Figure 2:
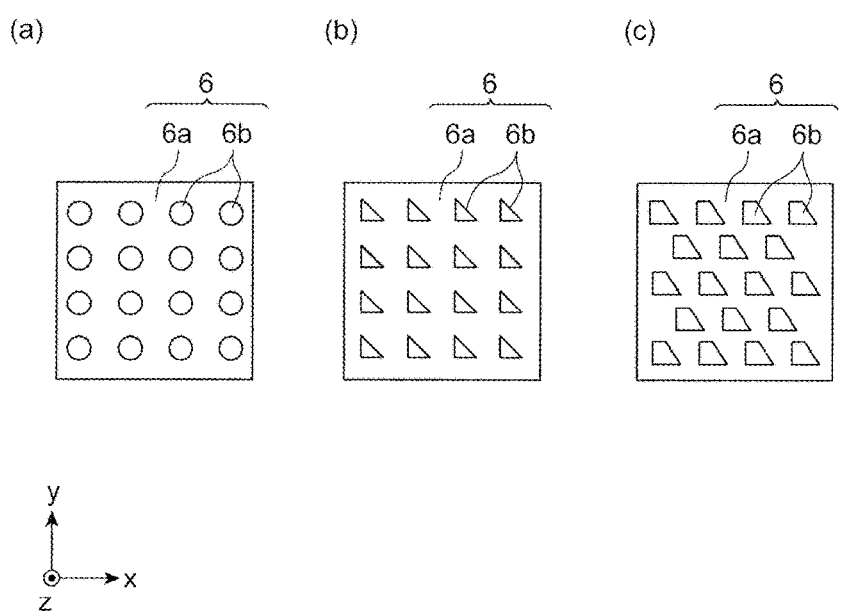
FIG. 2 are plan views of photonic crystal layers.

The photonic crystal layer 6 consists of, as shown in FIG. 2, a base layer 6a and a plurality of different refractive index portions 6b that are present in the base layer 6a and have a refractive index different from that of the base layer 6a. The different refractive index portions 6b may be holes containing a gaseous body such as air inside, or an insulating material or a semiconductor material. The plurality of different refractive index portions 6b are periodically distributed and disposed in the xy plane, and the planar shape of the different refractive index portion 6b (shape viewed from the z-axis direction) may be circular as shown in FIG. 2(b), or may be other shapes such as a triangle (isosceles right triangle) as shown in FIG. 2(b) or a trapezoid as shown in FIG. 2(c). The different refractive index portions 6b are disposed at lattice points of a virtual square lattice whose lattice lines are oriented along the x axis and the y axis, and are disposed translationally symmetrically, however, it is also possible that the different refractive index portions 6b are disposed at lattice points of a virtual triangular lattice.

When the planar shape of the different refractive index portion 6b is rotationally asymmetric about the z axis, a polarization component in a specific direction becomes great.

The thickness of the photonic crystal layer 6 (thickness of the base layer 6a) is approximately 300 nm (preferably, 150 to 350 nm). The photonic crystal layer 6 is made of i-type or p-type GaAs, however, it may be made of other materials such as i-type or p-type AlGaAs (may include cavities). The depth of the different refractive index portions 6b is, for example, 200 nm (preferably, 100 to 300 nm).

The material of the cladding layer 7 is, for example, AlGaAs, and the thickness is, for example, approximately 2000 nm (preferably, 500 to 4000 nm). A p-type impurity concentration in the cladding layer 7 can be set to $1\times10^{16}$ to $1\times10^{9}$ cm$^3$.

The material of the contact layer 8 is, for example, p-type GaAs, and the thickness is approximately 200 nm (preferably, 50 to 500 nm). The impurity concentration of the contact layer 8 is $1\times10^{19}$/cm$^{-3}$ or more.

The material of the electrode 9 is a mixture of a metal such as Au and a semiconductor such as Ge, and AuGe, AuGe/Au, or the like can be used. The materials of the electrode 10 are metals such as Au, Ti, Pt, and Cr, and in order from the semiconductor substrate side, Ti/Pt/Au, Ti/Au, or Cr/Au, etc., can be used. The shape of the electrode 10 is square, and has an area of 200×200 μm$^3$.

When manufacturing the above-described semiconductor laser element 1, it is formed, for example, as follows. On an n-type GaAs substrate 2, an n-type AlGaAs cladding layer 3, an AlGaAs guide layer, an active layer 4 with an InGaAs/AlGaAs multiquantum well structure, an AlGaAs carrier block layer (electron block layer 5), and a base layer 6a made of GaAs are epitaxial-grown in order.

After epitaxial growth of the base layer 6a, a periodic structure is patterned. That is, an SiN layer is deposited on the base layer 6a by the PCVD method, a resist is applied thereon, and a two-dimensional fine pattern is drawn with an electron beam lithography system. Thereafter, the two-dimensional fine pattern is transferred onto the SiN layer by development and dry-etching by reactive ion etching (RIE), and resist residue is removed. By dry-etching on the two-dimensional fine pattern on the SiN layer, the fine pattern is transferred onto the base layer 6a made of GaAs. Thereafter, the SiN layer is removed, and surface treatment is applied, and then by metal organic chemical vapor epitaxy (referred to as MOCVD), different refractive index portions 6b (embedded layer) made of AlGaAs (may include cavities), a p-type AlGaAs cladding layer 7, and a p-type GaAs contact layer 8 are regrown in order. Thereafter, by exposure and deposition techniques, a 200 μm-square electrode 10 is formed on the p side and an electrode 9 having an opening is formed on the n side. Through these steps, the PCSEL single element is formed.

Thereafter, various optical members such as a transmissive diffraction grating are disposed to face the light output surface of the semiconductor laser element as necessary.

As shown in FIG. 1(b), by housing the semiconductor laser element 1 described above in a package, the laser element 100 is completed. The package of the laser element 100 includes a tubular body B2 one opening end face of which is fixed to a base plate B1, and a light output window FP provided in the other opening end face of the tubular body B2. The base plate B1 is a stem plate through which electrode terminals T9 and T10 that are pins for supplying a current penetrate. Between the base plate B1 and the laser element 1, a sub-mount material such as SiC or CuW may be inserted as a heatsink. To the electrode terminals T9 and T10, electrodes 9 and 10 are respectively electrically connected via the electrode wires W9 and W10. To the semiconductor laser element being a laser diode, a current is supplied in the forward direction, and via the antireflective film 9a, light is output in a direction almost perpendicular to the light output surface. The light output window FP is made of glass or quartz material transparent with respect to output light, however, it can be made of a semiconductor such as Si to output infrared light with a waveband that does not cause absorption.

FIG. 1(c) shows laser equipment, and this laser equipment includes a drive circuit D that supplies a drive current I to the semiconductor laser element 1 described in the embodiment, and a control circuit C that controls the drive circuit D. Here, the drive current I is controlled so as to meet predetermined conditions. The control circuit C drives the drive circuit D at least at k≥269.13T$^{-0.4653}$ and J<1000 kA/cm$^2$. The standardized drive current k=I/Ith, I is a drive current to be supplied from the drive circuit D to the semiconductor laser element 1, T is a pulse width of the drive current I, and J is a current density of the drive current I flowing in the semiconductor laser element 1.

Figure 22:
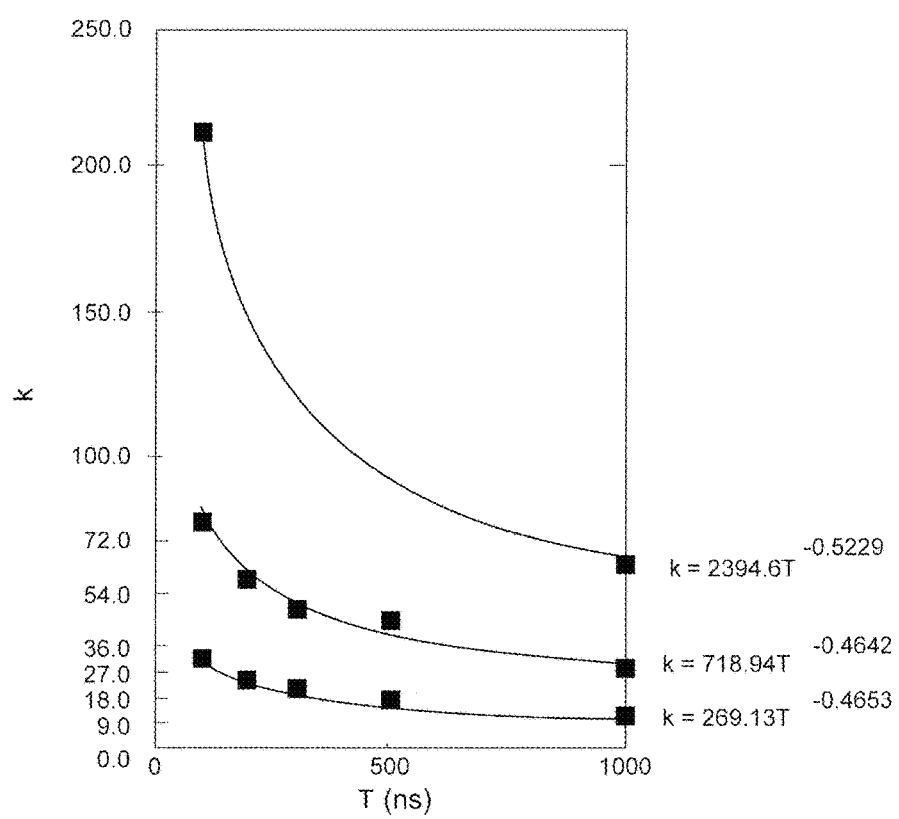
FIG. 22 is a graph showing a relationship between the pulse width T (ns) of the drive current I and the standardized drive current k.

FIG. 22 is a graph showing a relationship between the pulse width T (ns) of the drive current I and the standardized drive current k. Three approximate curves are shown, and the expression of the lowest curve is k=269.13T$^{-0.4653}$. When k meets the above-described relational expression, at least on a specific short wavelength side (band edge B), a laser beam with a wavelength width of 1 nm or more can be obtained. That is, in the case where k=269.13T$^{-0.4653}$, the relationship shown in FIG. 11(b) is met, and in the case where k=269.13T$^{-0.4653}$ or more, the spectra shown in FIG. 11(b) to FIG. 11(h) and FIG. 12(a) to FIG. 12(e) are obtained.

When the current density J is 1000 kA/cm$^2$ or more, the semiconductor laser element 1 may be broken, so that the current density J is set as described above.

The control circuit C can also drive the drive circuit D at k<718.94T$^{-0.4642}$. When this condition is met, an advantage that a laser beam can be obtained only on the short wavelength side (band edge B) is provided. That is, the middle approximate curve in FIG. 22 shows k=718.94T$^{-0.4642}$, and when this relationship is met, a laser beam is generated in two wavelength bands (band edge B and band edge A) (FIG. 11(e)), so that in the case where k<718.94T$^{-0.4642}$, a laser beam with a wavelength width of 1 nm or more can be obtained only on the short wavelength side (band edge B). That is, the spectra shown in FIG. 11(b) to FIG. 11(d) are obtained.

The control circuit C can also drive the drive circuit D at k≥718.94T$^{-0.4642}$. When this condition is met, a laser beam can be obtained not only on the short wavelength side (band edge B) but also on the long wavelength side (band edge A). That is, the spectra shown in FIG. 11(e) to FIG. 11(h) and FIG. 12(a) to FIG. 12(e) are obtained.

The control circuit C can drive the drive circuit D at k<2394.6T$^{-0.5229}$. When this condition is met, a laser beam can be obtained not only on the short wavelength side (band edge B) but also on the long wavelength side (band edge A), however, bands of these do not overlap, and the laser beams with the bands can be individually used. That is, the uppermost approximate curve shown in FIG. 22 shows k=2394.6T$^{-0.5229}$, and when this relationship is met, laser beams generated in two wavelength bands (band edge B and band edge A) overlap each other (FIG. 12(c)). That is, in the case where k<2394.6T$^{-0.5229}$, the spectra shown in FIG. 11(e) to FIG. 11(h) and FIG. 12(a) and FIG. 12(b) are obtained.

The control circuit C can drive the drive circuit D at k≥2394.6T$^{-0.5229}$. When this condition is met, a laser beam is generated not only on the short wavelength side (band edge B) but also on the long wavelength side (band edge A), and bands of these successively overlap (FIG. 12(c)). That is, in the case where k≥2394.6T$^{-0.5229}$, the spectra shown in FIG. 12(c) to FIG. 12(e) are obtained. Therefore, by integrating these, they can be used as a successive broadband laser beam, and by temporally resolving this, laser beams with individual wavelengths can be successively and selectively used.

The above-described semiconductor laser element 1 can be combined with various types of structures.

Figure 3:
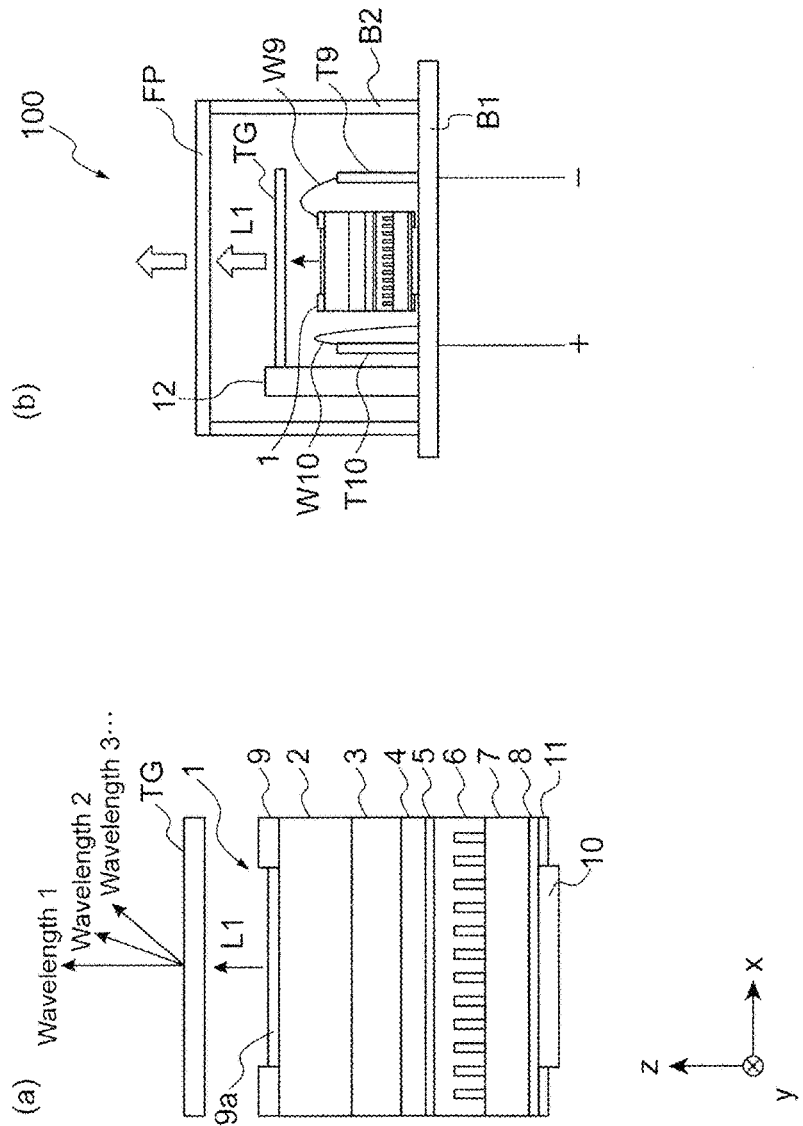
FIG. 3 are a longitudinal sectional view (FIG. 3(*a*)) of a photonic crystal laser element, and a longitudinal sectional view (FIG. 3(*b*)) of a laser element.

FIG. 3 are a longitudinal sectional view (FIG. 3(a)) of the semiconductor laser element 1, and a longitudinal sectional view (FIG. 3(b)) of laser element 100. The difference between the element shown in FIG. 3 and the element shown in FIG. 1 is only the point that the laser element includes a transmissive diffraction grating TG and a support member 12 supporting the transmissive diffraction grating TG. That is, this laser equipment further includes the transmissive diffraction grating TG disposed to face the semiconductor laser element 1. In this case, a traveling direction of a laser beam L1 output from the semiconductor laser element 1 is deflected with respect to each wavelength by being transmitted through the transmissive diffraction grating TG. The support member 12 is fixed to the base plate B1.

Figure 4:
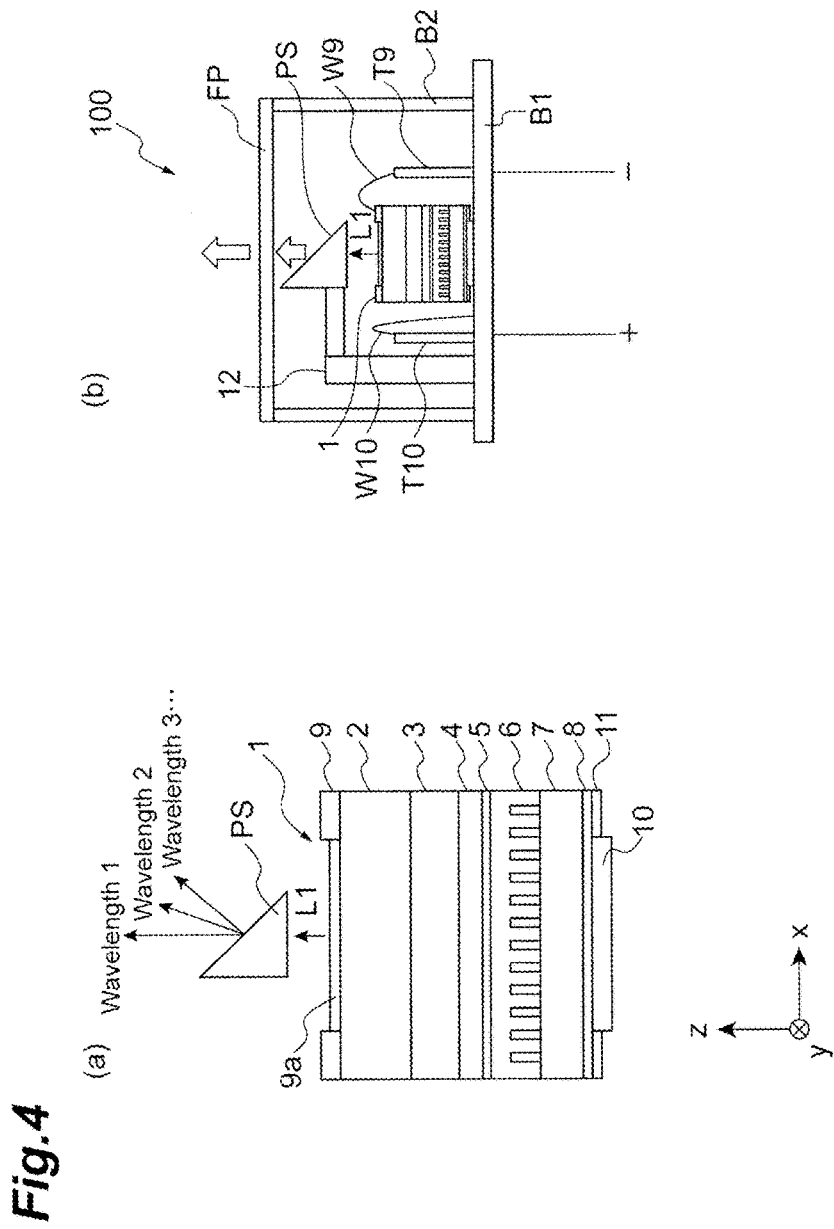
FIG. 4 are a longitudinal sectional view (FIG. 4(*a*)) of a photonic crystal laser element, and a longitudinal sectional view (FIG. 4(*b*)) of a laser element.

FIG. 4 are a longitudinal sectional view (FIG. 4(a)) of the semiconductor laser element 1, and a longitudinal sectional view (FIG. 4(b)) of laser element 100. The difference between the element shown in FIG. 4 and the element shown in FIG. 1 is only the point that the laser element includes a prism PS and a support member 12 supporting the prism PS. That is, this laser equipment further includes a prism disposed to face the photonic crystal laser element. In this case, a traveling direction of a laser beam output from the photonic crystal laser element is deflected with respect to each wavelength by being transmitted through the prism. The support member 12 is fixed to the base plate B1. A sectional shape in the xz plane of the prism PS is a right triangle, and a facing surface thereof is parallel to the light output surface of the semiconductor laser element 1.

Figure 5:
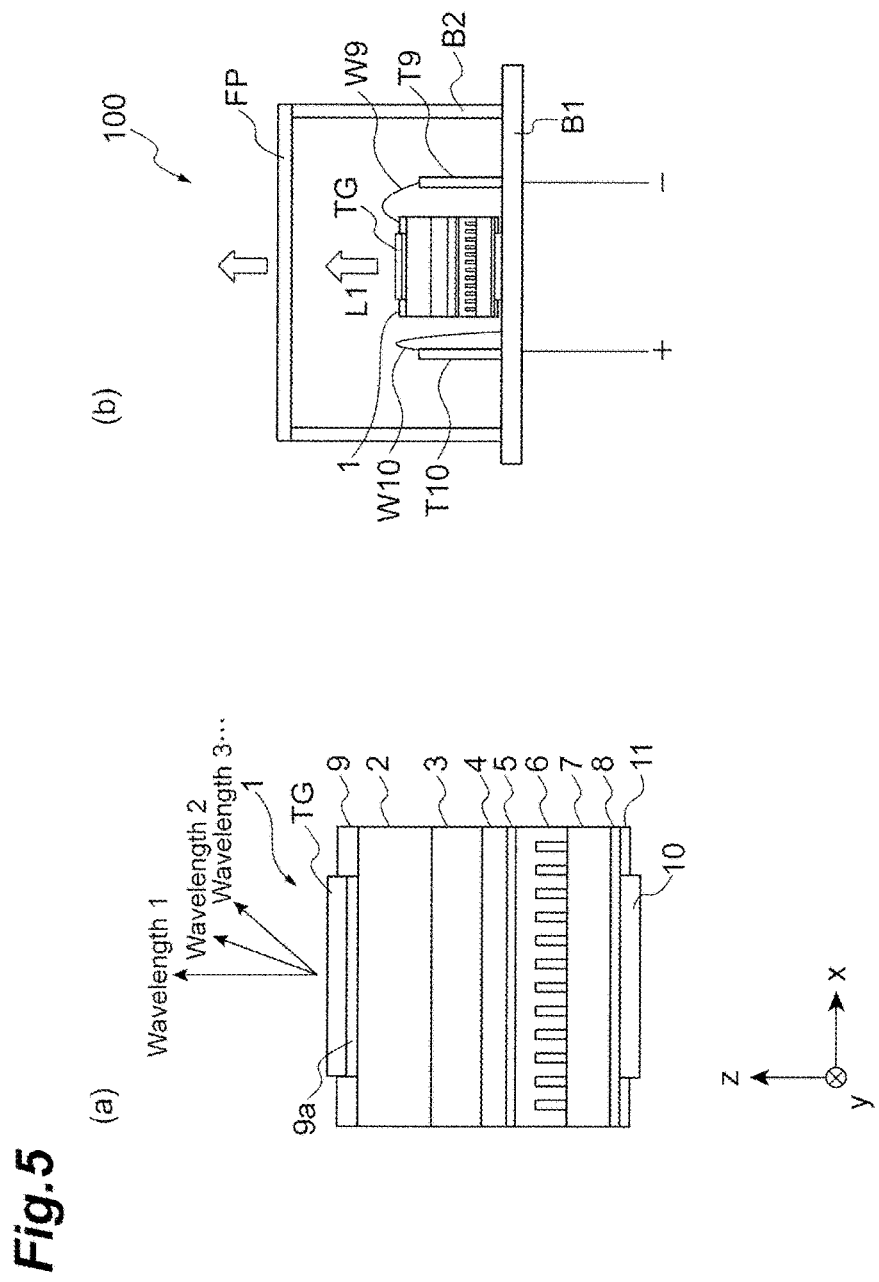
FIG. 5 are a longitudinal sectional view (FIG. 5(*a*)) of a photonic crystal laser element, and a longitudinal sectional view (FIG. 5(*b*)) of a laser element.

FIG. 5 are a longitudinal sectional view (FIG. 5(a)) of the semiconductor laser element 1, and a longitudinal sectional view (FIG. 5(b)) of laser element 100. The difference between the element shown in FIG. 5 and the element shown in FIG. 1 is only the point that the element further includes a transmissive diffraction grating fixed to the light output surface of the semiconductor laser element 1. In this case, the transmissive diffraction grating is fixed to the light output surface, so that in addition to the effect of the transmissive diffraction grating in the case of FIG. 3, an advantage that the number of components necessary for the configuration can be made small is provided.

Figure 6:
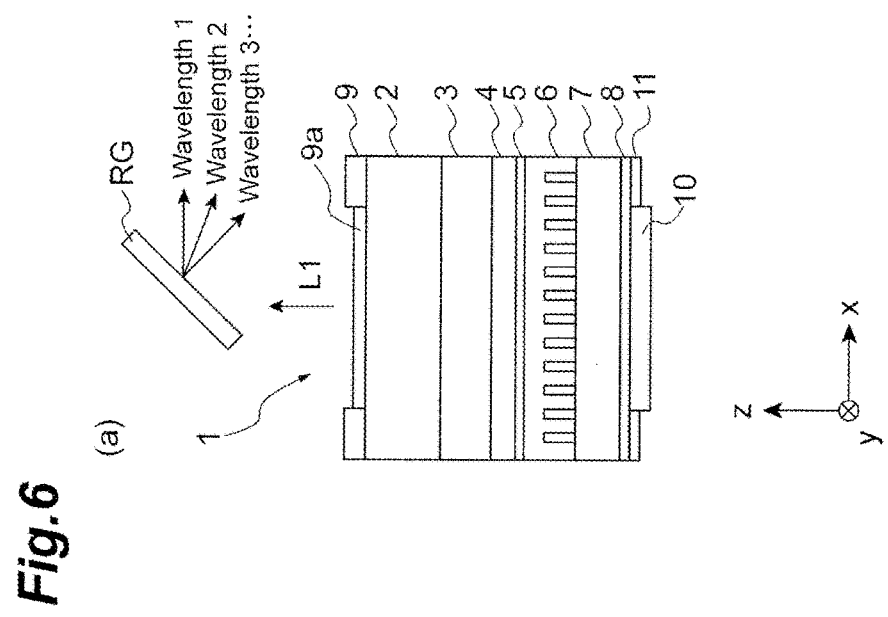
FIG. 6 are a longitudinal sectional view (FIG. 6(*a*)) of a photonic crystal laser element, and a longitudinal sectional view (FIG. 6(*b*)) of a laser element.

FIG. 6 are a longitudinal sectional view (FIG. 6(a)) of the semiconductor laser element 1, and a longitudinal sectional view (FIG. 6(b)) of laser element 100. The difference between the element shown in FIG. 6 and the element shown in FIG. 1 is only the point that the laser element includes a reflective diffraction grating RG and a support member 12 supporting the reflective diffraction grating RG. That is, this laser equipment further includes a reflective diffraction grating RG disposed to face the semiconductor laser element 1. In this case, the traveling direction of the laser beam L1 output from the semiconductor laser element 1 is deflected with respect to each wavelength by being reflected by the reflective diffraction grating RG. The support member 12 is fixed to the base plate B1.

The laser element 100 described above can be combined with an opening member, etc.

Figure 7:
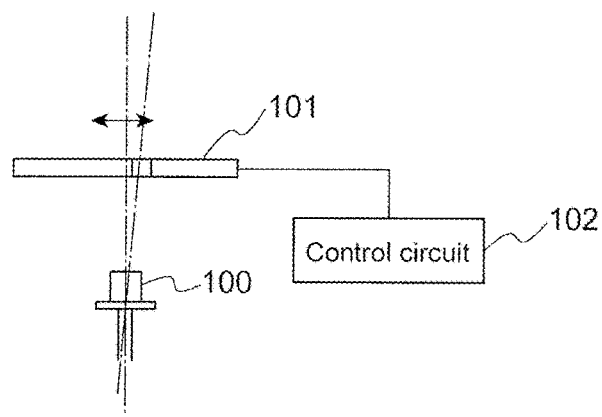
FIG. 7 is an explanatory view of laser equipment including a laser element that outputs a laser beam deflected with respect to each wavelength.

FIG. 7 is an explanatory view of laser equipment having a laser element that outputs a laser beam deflected with respect to each wavelength. This laser equipment further includes an opening member 101 that selectively transmits a component traveling in a specific direction of the laser beam output from the semiconductor laser element 1 or the laser element 100. By using the opening member 101, a laser beam with a specific wavelength component can be selectively extracted. In a case where a laser beam travels in almost the z-axis direction, a laser beam with a wavelength that passed through a through hole provided in the opening member 101 (a slit plate, an aperture member, or the like) passes through the opening member 101, and a laser beam that strikes a portion other than the through hole is blocked by the opening member 101. The opening member 101 can be moved along the x-axis direction by driving a driver not shown by the control circuit 102. Accordingly, wavelength scanning can be performed.

Figure 8:
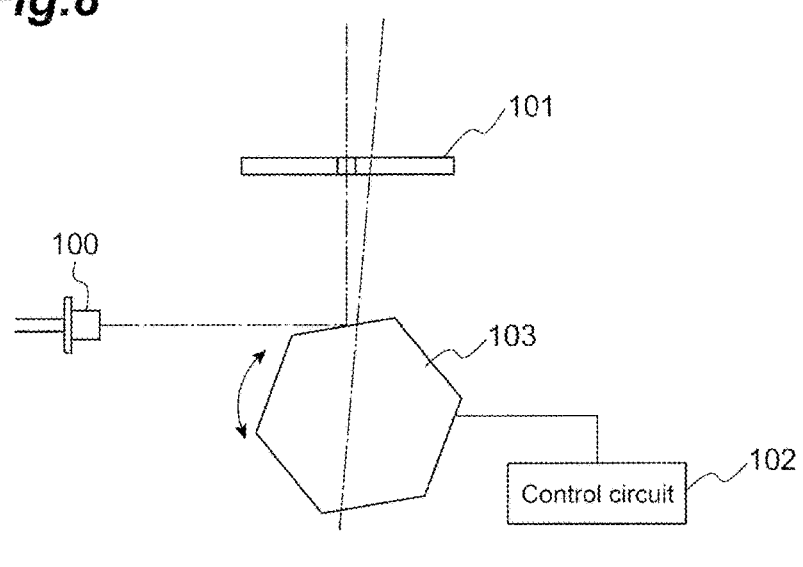
FIG. 8 is an explanatory view of laser equipment including a laser element that outputs a laser beam deflected with respect to each wavelength.
Figure 8:
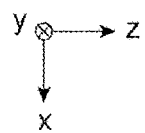

FIG. 8 is an explanatory view of laser equipment including a laser element that outputs a laser beam deflected with respect to each wavelength. This laser equipment includes a polygon mirror 103 (deflector) that reflects a laser beam output from the semiconductor laser element 1 or the laser element 100 in a desired direction, and a wavelength component that travels in a specific direction of the deflected laser beam can be selectively transmitted through the opening member 101. The wavelength to be transmitted through the opening member 101 differs depending on the rotating position of the polygon mirror 103. The polygon mirror 103 can be rotated around the y axis by driving a driver not shown by the control circuit 102. Accordingly, wavelength scanning can be performed.

Figure 9:
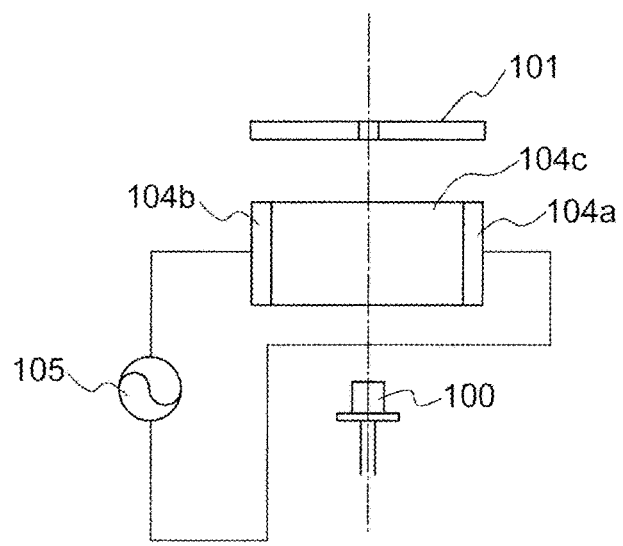
FIG. 9 is an explanatory view of laser equipment including a laser element that outputs a laser beam deflected with respect to each wavelength.

FIG. 9 is an explanatory view of laser equipment including a laser element that outputs a laser beam deflected with respect to each wavelength. This laser equipment includes an electric optical crystal 104c (deflector) that deflects a laser beam output from the semiconductor laser element 1 or the laser element 100 in a desired direction, and a wavelength component that travels in a specific direction of the deflected laser beam can be selectively transmitted through the opening member 101. On both ends in the x-axis direction of the electric optical crystal 104c, electrodes 104a and 104b are provided, and between these electrodes, an alternate current is applied from an AC power supply 105, and the deflecting direction can be changed by the orientation and magnitude of the applied voltage. Accordingly, wavelength scanning can be performed. As a material of the electric optical crystal 104c, for example, potassium tantalate niobate ($KTa_{1-x}Nb_xO_3$) provided that x is a composition ratio of Nb, or the like can be used.

Thus, the laser equipment described above further includes a deflector that deflects a traveling direction of a laser beam output from the semiconductor laser element 1, and can output a laser beam with a specific wavelength in a desired direction.

Figure 10:
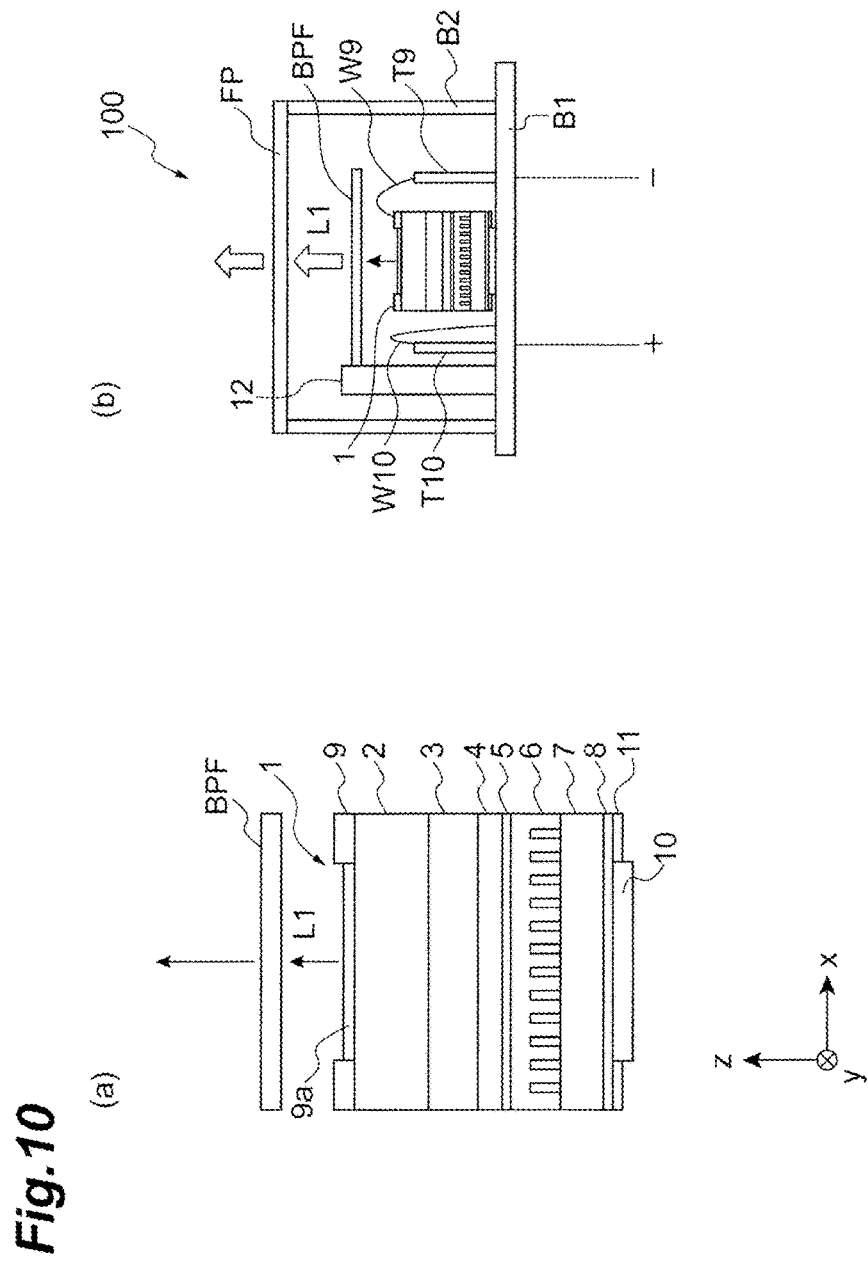
FIG. 10 are a longitudinal sectional view (FIG. 10(*a*)) of a photonic crystal laser element, and a longitudinal sectional view (FIG. 10(*b*)) of a laser element.

FIG. 10 are a longitudinal sectional view (FIG. 10(a)) of a semiconductor laser element 1, and a longitudinal sectional view (FIG. 10(b)) of laser element. A difference between the element shown in FIG. 3 and the element shown in FIG. 1 is only the point that the laser element includes a bandpass filter BPF and a support member 12 supporting the bandpass filter BPF. That is, this laser equipment further includes a bandpass filter BPF disposed to face the semiconductor laser element 1. In this case, in a laser beam with a plurality of wavelengths output from the semiconductor laser element 1, only a specific wavelength component can be selectively transmitted through the bandpass filter BPF. The support member 12 is fixed to a base plate B1. The bandpass filter BPF may be disposed integrally with the element as shown in FIG. 5.

Next, control of the above-described drive current I is described in detail.

Figure 11:
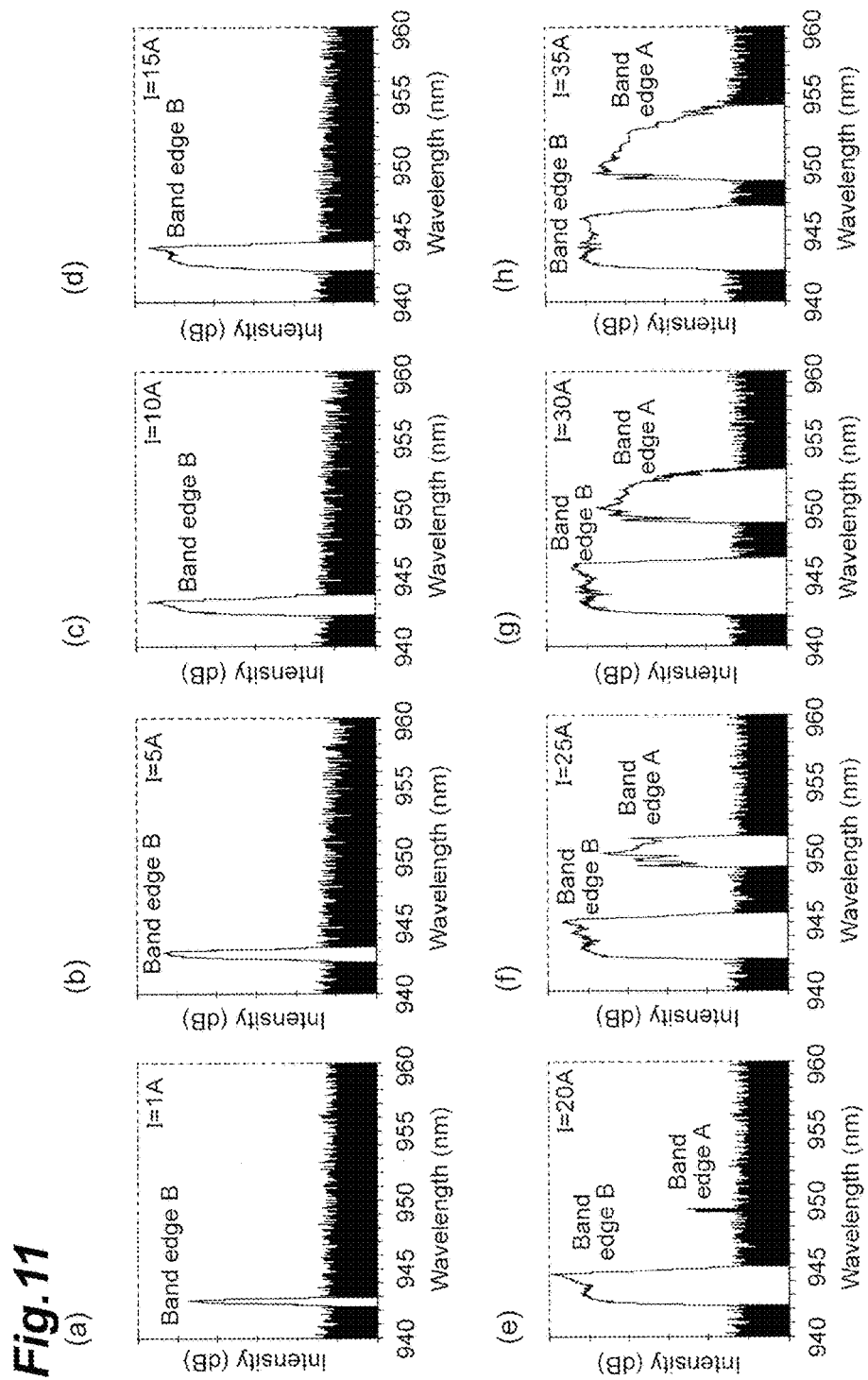
FIG. 11 are graphs showing relationships between the wavelength (nm) and the intensity (dB) of the laser beam.
Figure 12:
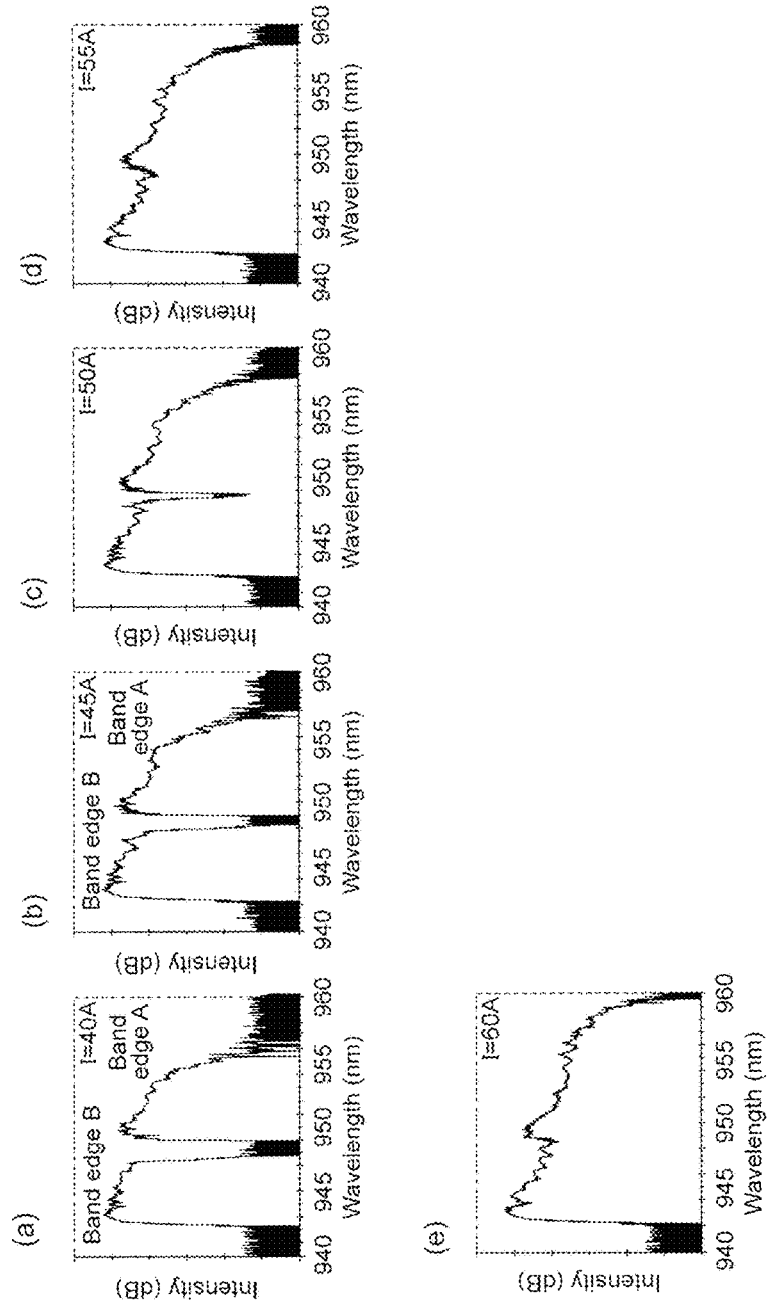
FIG. 12 are graphs showing relationships between the wavelength (nm) and the intensity (dB) of the laser beam.

FIG. 11 and FIG. 12 are graphs showing relationships between the wavelength (nm) and the intensity (dB) of the laser beam. In the case where the drive current I=1 A, at the band edge B (near the wavelength of 942.5 nm), a spectrum is observed (a), and its wavelength width is less than 1 nm. In the case where the drive current I=5 A, at the band edge B (near the wavelength of 942.5 nm), a spectrum with a wavelength width of 1 nm or more is observed (a). As the drive current I increases, the wavelength width increases, and when the drive current I=20 A, at the band edge A (near the wavelength of 948 nm), a spectrum appears. As the drive current I is further increased, the wavelength widths gradually increase, and at last, the wavelength bands of the spectra overlap (FIG. 12(e)), and when the drive current I=50 A and 60 A, the spectra of the two bands completely successively overlap.

Figure 24:
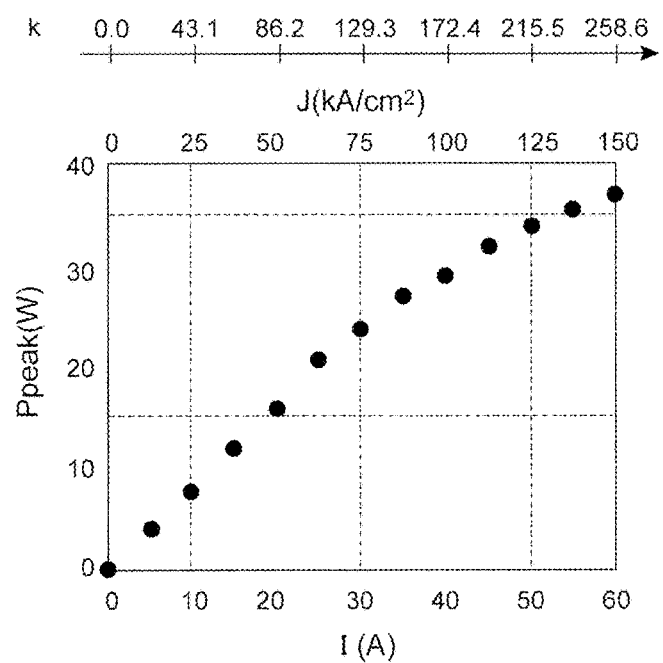
FIG. 24 is a graph showing a relationship between the drive current I (A) and the peak power Ppeak (W).

When creating these graphs, the pulse width T of the drive current I=100 ns, and the repetition frequency of the drive current I=1 kHz, the temperature=20° C., the threshold current Ith of the semiconductor laser element=232 mA (measured during continuous emission), and the threshold Jth of the current density J=0.58 kA/cm$^2$ to 0.6 kA/cm$^2$. For spectral measurement, a multi-mode fiber was directly attached to the semiconductor laser element, and a spectral analyzer (AQ6373) manufactured by Yokogawa Electric Corporation was used. FIG. 24 shows a relationship between the drive current I (A) and the peak power (W) in this case. As the drive current I increased, the peak power Ppeak increased, and when I=60 A, a peak power Ppeak of 36.9 W was obtained. As a photonic crystal layer, one shown in FIG. 2(b) was adopted, and the intervals in the x-axis direction and the y-axis direction of the different refractive index portions 6b were set to 287 nm, the depths were set to 230 nm, and the maximum diameter was set to 170 nm.

The wavelength width W of the laser beam is prescribed as a range that provides power of −40 dB or more with respect to the peak power.

Figure 13:
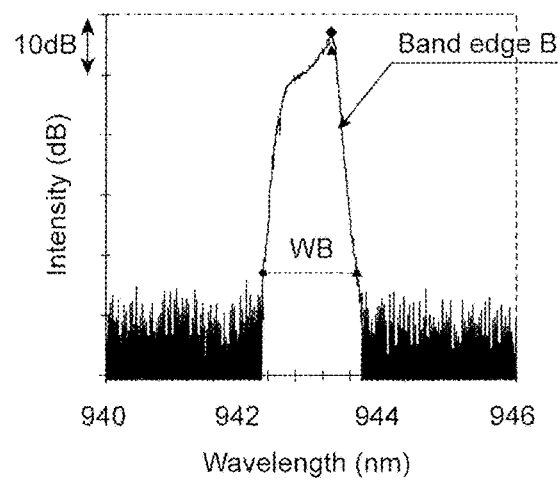
FIG. 13 is a graph showing a relationship between the wavelength (nm) and the intensity (dB) of the laser beam.

FIG. 13 is a graph showing a relationship between the wavelength (nm) and the intensity (dB) of the laser beam.

The drive current I=10 A, the current density J=25 kA/cm$^2$, and the standardized drive current k=42.7. In this case, the wavelength width WB at the band edge B is represented by a wavelength width at a position lowered by −40 dB from the peak intensity (dB) as shown in the figure.

Figure 14:
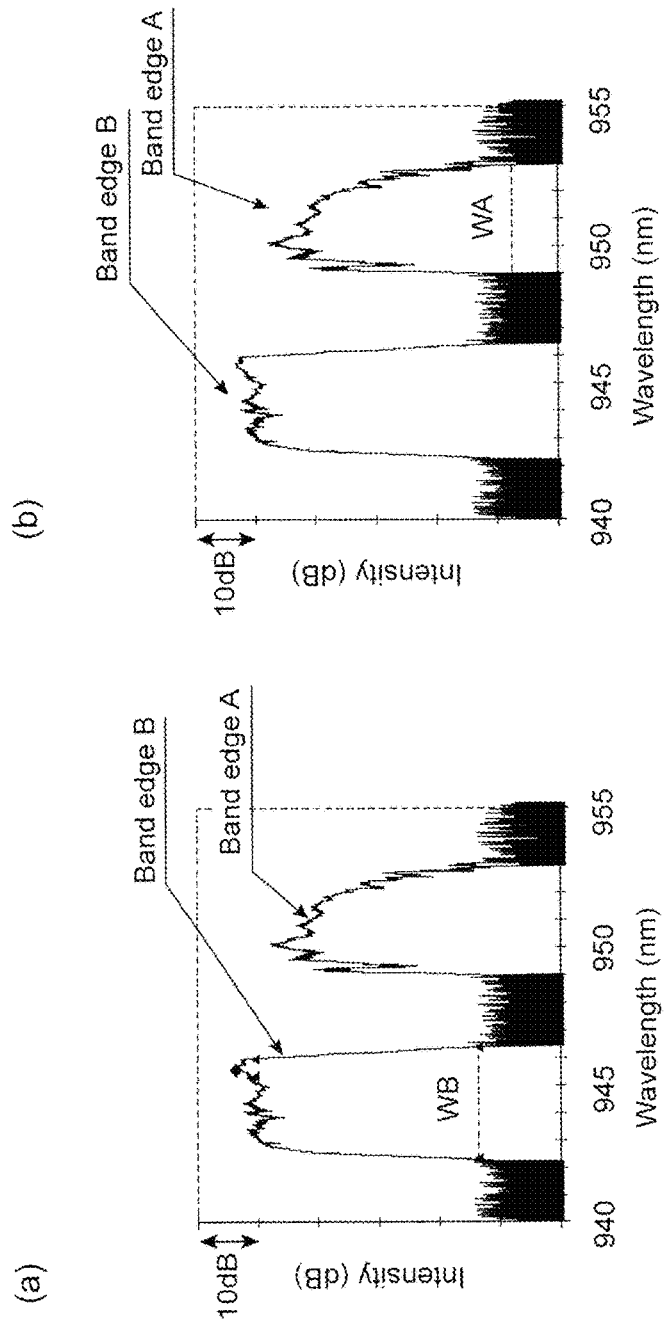
FIG. 14 are graphs showing relationships between the wavelength (nm) and the intensity (dB) of the laser beam.

FIG. 14 are graphs showing relationships between the wavelength (nm) and the intensity (dB) of the laser beam.

The drive current I=30 A, the current density J=75 kA/cm$^2$, and the standardized drive current k=106.8. In this case, the wavelength widths WB and WA at the band edges B and A are represented by wavelength widths at positions lowered by −40 dB from the peak intensities (dB) as shown in FIG. 14(a) and FIG. 14(b).

Figure 15:
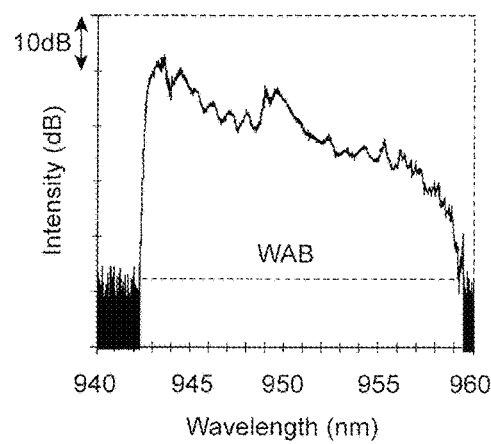
FIG. 15 is a graph showing a relationship between the wavelength (nm) and the intensity (dB) of the laser beam.

FIG. 15 is a graph showing a relationship between the wavelength (nm) and intensity (dB) of the laser beam.

The drive current I=60 A, the current density J=150 kA/cm$^2$, and the standardized drive current k=256.4. In this case, the wavelength width WAB as the union of the band edge B and the band edge A is represented by the wavelength width at a position lowered by −40 dB from the peak intensity (dB) as shown in the figure.

Figure 16:
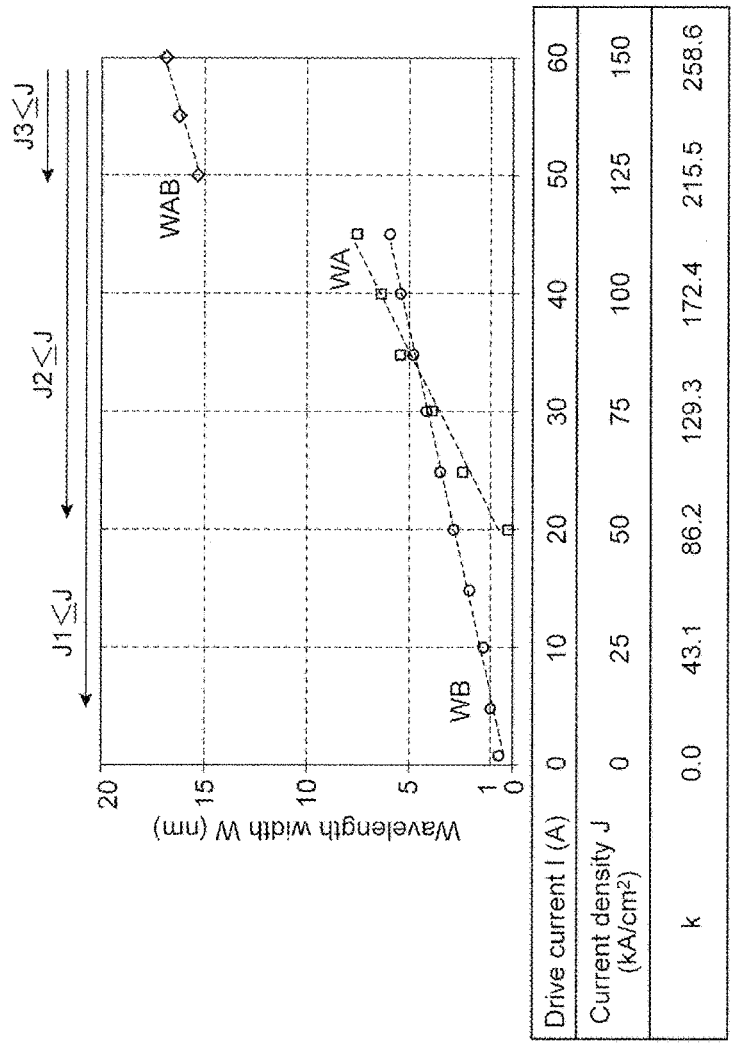
FIG. 16 is a graph showing a relationship between the drive current I (A), the current density J (kA/cm$^2$), and the standardized drive current k, and the wavelength width W (nm) of the laser beam (repetition frequency=1 kHz).

FIG. 16 is a graph showing a relationship between the drive current I (A), the current density J (kA/cm$^2$), the standardized drive current k, and the wavelength width W (nm) of the laser beam (repetition frequency=1 kHz). FIG. 17 is a chart showing data of the graph shown in FIG. 16.

The drive current I (A), the current density J (kA/cm$^2$), and the standardized drive current k are proportional to each other. When the standardized drive current k is 21.6 or more, the wavelength width WB at the band edge B becomes 1 nm or more, and as the drive current I increases, the wavelength width WB increases. When the standardized drive current k is 91.1 (linearly interpolated: I=21.1 A, J=52.8 kA/cm$^2$) or more, a spectrum with a wavelength width of 1 nm or more at the band edge A is also generated, and as the drive current I increases, the wavelength width WA increases. When the standardized drive current k is 215.5 or more, the spectra at the band edges A and B unite with each other, and as the drive current I increases, the wavelength width WAB increases.

As described above, on the assumption that the boundary values of the current density J the state of which varies are J1=12.5 kA/cm$^2$ (k=21.6), J2=52.8 kA/cm$^2$ (k=91.1), and J3=125 kA/cm$^2$ (k=215.5), a condition of the current density J under which oscillation occurs only at the band edge B is J1≤J, a condition of the current density J under which oscillation occurs at both of the band edges A and B is J2≤J, and a condition of the current density J under which the spectra at the band edges A and B unite with each other is J3≤J.

Next, influences of the repetition frequency were investigated.

Figure 18:
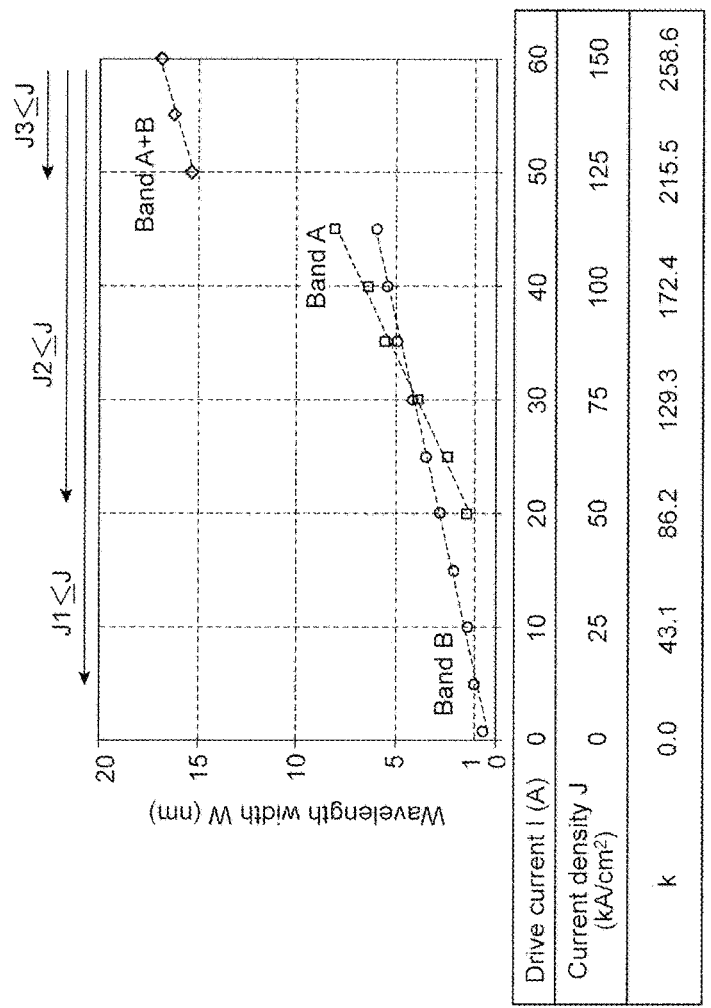
FIG. 18 is a graph showing a relationship between the drive current I (A), the current density J (kA/cm$^2$), and the standardized drive current k, and the wavelength width W (nm) of the laser beam (repetition frequency=10 kHz).

FIG. 18 is a graph showing a relationship between the drive current I (A), the current density J (kA/cm$^2$), and the standardized drive current k, and the wavelength width W (nm) of the laser beam (repetition frequency=10 kHz). FIG. 19 is a chart showing data of the graph shown in FIG. 18.

When the standardized drive current k is 21.6 or more, the wavelength width WB at the band edge B is 1 nm or more, and as the drive current I increases, the wavelength width WB increases. When the standardized drive current k becomes 81.4 (linearly interpolated: I=18.9 A, J=47.2 kA/cm$^2$) or more, a spectrum with a wavelength width of 1 nm or more at the band edge A is also generated, and as the drive current I increases, the wavelength width WA increases. When the standardized drive current k becomes 215.5 or more, the spectra at the band edges A and B unite with each other, and as the drive current I increases, the wavelength width WAB increases.

As described above, on the assumption that the boundary values of the current density J the state of which varies are J1=12.5 kA/cm$^2$ (k=21.6), J2=47.2 kA/cm$^2$ (k=81.4), and J3=125 kA/cm$^2$ (k=215.5), a condition of the current density J under which oscillation occurs only at the band edge B is J1≤J, a condition of the current density J under which oscillation occurs at both of the band edges A and B is J2≤J, and a condition of the current density J under which the spectra at the band edges A and B unite with each other is J3≤J.

Figure 20:
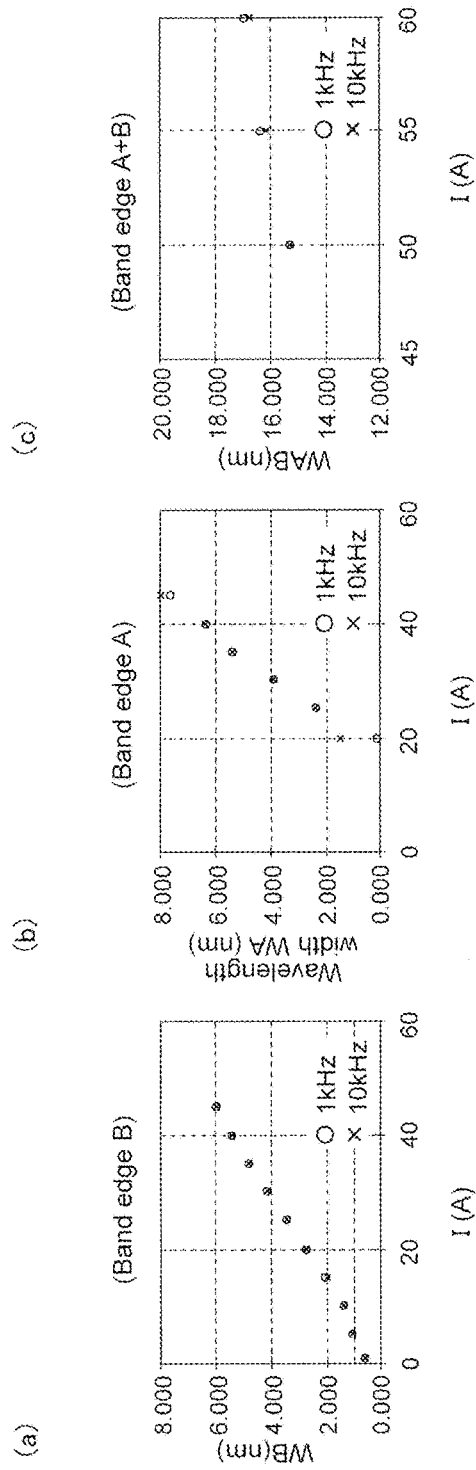
FIG. 20 are graphs showing relationships between the drive current I (A) and the wavelength widths WB, WA, and WAB (nm) of the laser beam.

FIG. 20 are graphs showing relationships between the drive current I (A) and the wavelength widths WB, WA, and WAB (nm) of the laser beam. Even when the repetition frequency is changed, the wavelength width WB at the band edge B and the wavelength width WAB obtained by union of the band edges hardly change (FIG. 20(*a*) and FIG. 20(*c*)), and only a slight change within the margin of error of the wavelength width WA at the band edge A is observed. Therefore, there is little dependency on the repetition frequency, and as described with reference to FIG. 22, the spectral property can be regarded as being determined depending on the standardized drive current k and the pulse width T.

Figure 21:
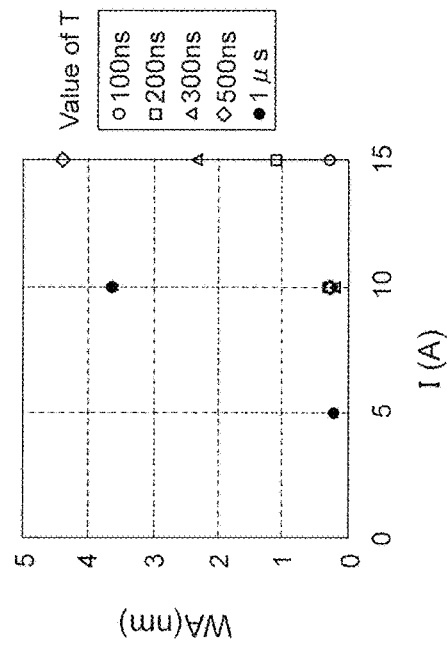
FIG. 21 are graphs showing relationships between the drive current I (A) and the wavelength widths WB and WA of the laser beam with respect to each pulse width T of the drive current I.
Figure 21:
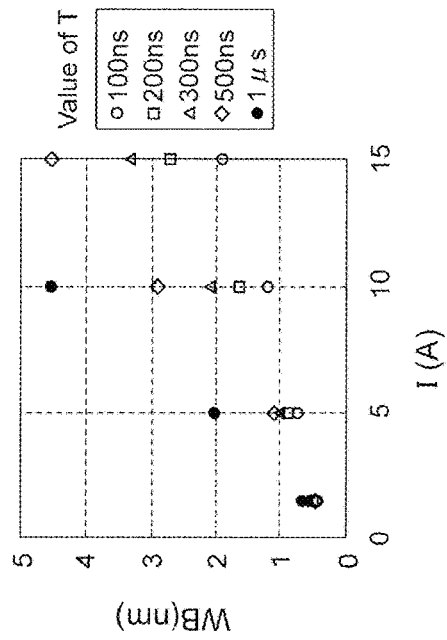

FIG. 21 are graphs showing relationships between the drive current I (A) and the wavelength widths WB and WA of the laser beam with respect to each pulse width T of the drive current I. The drive current I is 15 A, the current density J is 37.5 kA/cm$^2$, and the standardized drive current is 64.7. In this case, when the pulse width T was changed to 100 ns to 1 μs, a tendency for the wavelength widths WB and WA to increase as the pulse width T became larger was confirmed. That is, by increasing the pulse width T, the wavelength width can be increased even if the drive current is made smaller. If the drive current is small, the heating value is small, and this brings about an effect in which the equipment design is simplified.

By setting the pulse width T to 100 ns and the drive current I to 50 A or more, a broadband laser beam with a wavelength range of 15 nm or more can be generated.

FIG. 22 is a graph showing a relationship between the pulse width T (ns) of the drive current I and the standardized drive current k. As described above, it is found that when the pulse width T is changed to 100 ns to 1000 ns, the larger the pulse width T, the smaller the standardized drive current k.

Figure 23:
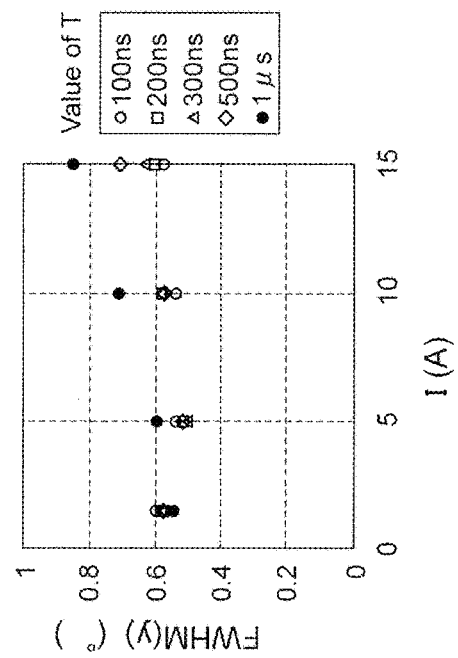
FIG. 23 are graphs showing relationships between the drive current I (A) and the full widths at half maximums (FWHM) of beam spread angles of the laser beam with respect to each pulse width T of the drive current I.
Figure 23:
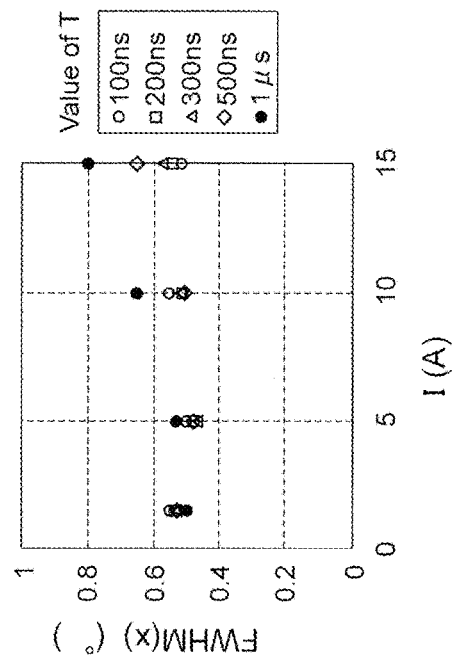

FIG. 23 are graphs showing relationships between the drive current I (A) and the full width at half maximum (FWHM (x) (°)) of a beam spread angle in the x-axis direction and the full width at half maximum (FWHM (y) (°)) of a beam spread angle in the y-axis direction of a far-field pattern of the laser beam with respect to each pulse width T of the drive current I.

A spread angle (in the x-axis direction) of a laser beam referred to herein is a value (FWHM) shown by an angle (full width) formed between two lines respectively connecting two positions at which the beam intensity of a far-field pattern in the xy plane becomes a half of a peak intensity on the optical axis in the distribution along the x axis and the tip position of the cone (light output position).

Similarly, a spread angle (in the y-axis direction) of a laser beam is a value (FWHM) shown by an angle (full width) formed between two lines respectively connecting two positions at which the beam intensity of a far-field pattern in the xy plane becomes a half of a peak intensity on the optical axis in the distribution along the y axis and the tip position of the cone (light output position).

Observing the far-field pattern of the laser beam, when the pulse width T is 1 μs or more, the beam spread angle is large, so that to obtain a laser beam with a narrow spread angle, the pulse width T is preferably 500 ns or less. As described above, broadband wavelength sweeping that was conventionally difficult is enabled, and while a narrow radiation beam is maintained, wavelength sweeping for a wavelength band of 15 nm or more is enabled. By a PCSEL, a 1° or less narrow radiation beam is obtained, so that the optical system of the semiconductor laser can be simplified, and optical axis adjustment becomes easy. When a transmissive diffraction grating is used, the incidence plane of the spectroscopic unit becomes perpendicular to the laser element, so that an advantage that deviation of the optical system hardly occurs is obtained. In addition, by using a single laser element, broadband wavelength scanning can be easily realized.

A beam pattern of the above-described laser beam was observed.

Figure 25:
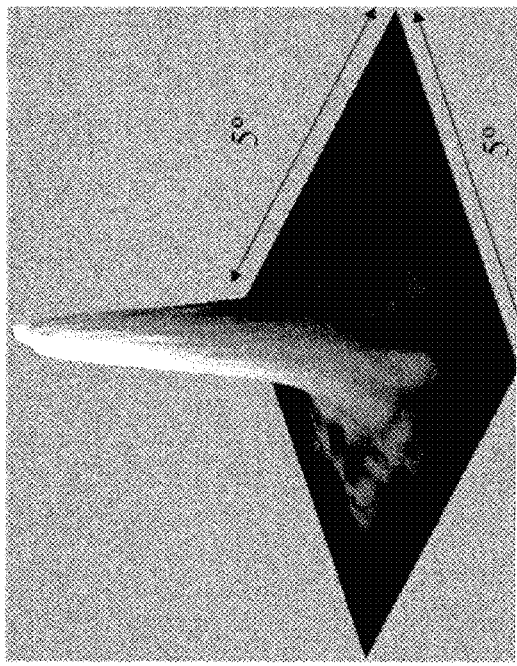
FIG. 25 are a photograph (a) of a beam two-dimensional pattern of the laser beam and an image (b) of a three-dimensional form of the laser beam.
Figure 25:
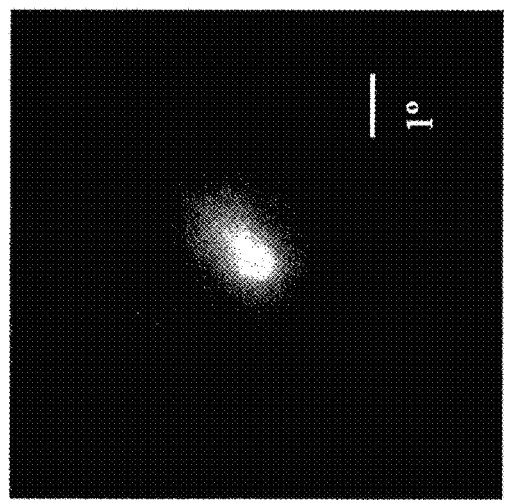

FIG. 25 are FIG. 25(*a*) showing a photograph of a beam two-dimensional pattern of the laser beam, and FIG. 25(*b*) showing an image that represents a three-dimensional form of the laser beam. The laser beam is radiated in a roughly conical shape as shown in FIG. 25(*b*). In FIG. 25(*b*), the tip position of the roughly conical shape is the laser beam output position. The pulse width T of the drive current I=100 ns, the repetition frequency of the drive current I=1 kHz, the temperature=20° C., the drive current I=60 A, and the light output is 36.9 W.

In this case, the spread angles (in the case of the above-described FWHM) of the laser beam in the x-axis direction and the y-axis direction were not more than 1°. As shown in FIG. 25(b), an angle (full width) between two lines respectively connecting two points at which the beam intensity of the far-field pattern along the x axis or the y axis becomes 1% or less of the peak intensity on the optical axis and the tip of the cone is not more than 5°.

Regarding the above-described broadband laser beam, at very short time intervals, a narrowband laser beam is output, however, by sweeping the wavelength, a broadband laser beam is output. Therefore, by integrating this, the laser beam can be used as a successive broadband laser beam, and by temporally resolving this, laser beams with individual wavelengths can be successively and selectively used.

REFERENCE SIGNS LIST

2 . . . semiconductor substrate, 3 . . . cladding layer, 4 . . . active layer, 5 . . . electron block layer, 6 . . . photonic crystal layer (diffraction grating layer), 7 . . . cladding layer, 8 . . . contact layer, 9, 10 . . . electrode, 9a . . . antireflection film, 11 . . . insulating film, D . . . drive circuit, C . . . control circuit.

The invention claimed is:
1. Laser equipment comprising:
a photonic crystal laser element whose threshold current is Ith, the photonic crystal laser element comprising:
an n-type electrode in contact with a semiconductor substrate;
an n-type cladding layer;
an active layer;
an electron block layer;
a photonic crystal layer having a base layer and a plurality of refractive index portions;
a p-type cladding layer; and
a p-type contact layer in contact with a p-type electrode;
a drive circuit that drives the photonic crystal laser element; and
a control circuit that controls the drive circuit, wherein when a standardized drive current k=I/Ith,
I is a drive current supplied from the drive circuit to the photonic crystal laser element,
T is a pulse width (ns) of the drive current I, and
J is a current density of the drive current I flowing in the photonic crystal laser element, the control circuit drives the drive circuit under the condition of
$k \geq 269.13 T^{-0.4653}$, and
$J < 1000$ kA/cm$^2$.

2. The laser equipment according to claim 1, wherein the control circuit drives the drive circuit under the condition of $k < 2394.6 T^{-0.5229}$.

3. The laser equipment according to claim 1, wherein the control circuit drives the drive circuit under the condition of $k \geq 2394.6 T^{-0.5229}$.

4. The laser equipment according to claim 1, further comprising: a transmissive diffraction grating disposed to face the photonic crystal laser element.

5. The laser equipment according to claim 4, further comprising: an opening member that selectively transmits a component traveling in a specific direction of a laser beam output from the photonic crystal laser element.

6. The laser equipment according to claim 5, further comprising: a deflector that deflects a traveling direction of a laser beam output from the photonic crystal laser element.

7. The laser equipment according to claim 4, further comprising: a deflector that deflects a traveling direction of a laser beam output from the photonic crystal laser element.

8. The laser equipment according to claim 1, further comprising: a prism disposed to face the photonic crystal laser element.

9. The laser equipment according to claim 8, further comprising: an opening member that selectively transmits a component traveling in a specific direction of a laser beam output from the photonic crystal laser element.

10. The laser equipment according to claim 9, further comprising: a deflector that deflects a traveling direction of a laser beam output from the photonic crystal laser element.

11. The laser equipment according to claim 8, further comprising: a deflector that deflects a traveling direction of a laser beam output from the photonic crystal laser element.

12. The laser equipment according to claim 1, further comprising: a transmissive diffraction grating fixed to a light output surface of the photonic crystal laser element.

13. The laser equipment according to claim 12, further comprising: an opening member that selectively transmits a component traveling in a specific direction of a laser beam output from the photonic crystal laser element.

14. The laser equipment according to claim 13, further comprising: a deflector that deflects a traveling direction of a laser beam output from the photonic crystal laser element.

15. The laser equipment according to claim 12, further comprising: a deflector that deflects a traveling direction of a laser beam output from the photonic crystal laser element.

16. The laser equipment according to claim 1, further comprising: a reflective diffraction grating disposed to face the photonic crystal laser element.

17. The laser equipment according to claim 16, further comprising: an opening member that selectively transmits a component traveling in a specific direction of a laser beam output from the photonic crystal laser element.

18. The laser equipment according to claim 17, further comprising: a deflector that deflects a traveling direction of a laser beam output from the photonic crystal laser element.

19. The laser equipment according to claim 16, further comprising: a deflector that deflects a traveling direction of a laser beam output from the photonic crystal laser element.

20. The laser equipment according to claim 1, further comprising: a bandpass filter disposed to face the photonic crystal laser element.

21. The laser equipment according to claim 1, further comprising:
a p-type electrode provided on one side of the laser equipment; and
an n-type electrode provided on the other side of the laser equipment.

22. The laser equipment according to claim 1, wherein the semiconductor substrate comprises GaAs.

23. The laser equipment according to claim 1, wherein the electron block layer comprises AlGaAs.

24. The laser equipment according to claim 1, wherein the photonic crystal comprises GaAs or AlGaAs.

25. The laser equipment according to claim 1, wherein the active layer comprises quantum well layers comprised of InGaAs and AlGaAs.

26. The laser equipment according to claim 1, wherein the control circuit drives the drive circuit under the condition of $k < 718.94 T^{-0.4642}$.

27. The laser equipment according to claim 1, wherein the control circuit drives the drive circuit under the condition of $k \geq 718.94T^{-0.4642}$.

\* \* \* \* \*